(12) United States Patent
Horng et al.

(10) Patent No.: US 8,876,499 B2
(45) Date of Patent: *Nov. 4, 2014

(54) FAN MODULE

(75) Inventors: Alex Horng, Kaohsiung (TW);
Wen-Kuan Chen, Kaohsiung (TW)

(73) Assignee: Sunonwealth Electric Machine Industry Co., Ltd., Kaohsiung (TW)

( * ) Notice: Subject to any disclaimer, the term of this patent is extended or adjusted under 35 U.S.C. 154(b) by 667 days.

This patent is subject to a terminal disclaimer.

(21) Appl. No.: 13/026,430

(22) Filed: Feb. 14, 2011

(65) Prior Publication Data

US 2012/0156063 A1 Jun. 21, 2012

(30) Foreign Application Priority Data

Dec. 16, 2010 (TW) .............................. 99144213 A

(51) Int. Cl.
*F04B 17/00* (2006.01)
*F04B 35/04* (2006.01)
*F04D 29/02* (2006.01)
(Continued)

(52) U.S. Cl.
CPC ............ *F04D 17/04* (2013.01); *F04D 25/0613* (2013.01); *F04D 29/582* (2013.01); *H05K 7/20172* (2013.01); *F04D 25/166* (2013.01)
USPC ................... 417/423.5; 417/423.14; 415/203; 415/206; 415/208.1; 415/220; 416/201 R; 416/175; 361/695

(58) Field of Classification Search
CPC ... F04D 19/002; F04D 19/007; F04D 29/327; F04D 29/4233; F04D 29/424; F04D 29/4246; F04D 29/4253; F04B 17/00

USPC ............... 417/321, 423.5, 423.14, 426; 415/208.1, 203, 206, 220; 416/201 R, 416/175 R; 361/695
See application file for complete search history.

(56) References Cited

U.S. PATENT DOCUMENTS 5,816,319 A * 10/1998 Kamekawa et al. .......... 165/121
6,568,905 B2 * 5/2003 Horng et al. .................. 415/206
(Continued)

FOREIGN PATENT DOCUMENTS

CN 1727689 2/2006
DE 19741161 6/1999
(Continued)

OTHER PUBLICATIONS

Machine Translation JP 2005 214107.*

*Primary Examiner* — Charles Freay
*Assistant Examiner* — Lilya Pekarskaya
(74) *Attorney, Agent, or Firm* — Alan Kamrath; KAMRATH IP Lawfirm, P.A.

(57) ABSTRACT

A fan module includes a housing and at least one impeller. The housing includes first and second air channels. The housing further includes an axial air inlet in communication with the first air channel and a radial air inlet in communication with the second air channel. The housing further includes at least one radial air outlet in communication with the first and second air channels. The at least one impeller draws external air into the housing via the axial air inlet or the radial air inlet and expels air out of the housing via the at last one radial air outlet. By such an arrangement, external air can be guided into the fan module via different directions, providing an enhanced cooling effect.

33 Claims, 10 Drawing Sheets

(51) Int. Cl.

| | |
|---|---|
| *F04D 29/44* | (2006.01) |
| *F04D 29/54* | (2006.01) |
| *F04D 29/52* | (2006.01) |
| *F03B 1/00* | (2006.01) |
| *F03B 11/02* | (2006.01) |
| *F03B 5/00* | (2006.01) |
| *F04D 3/00* | (2006.01) |
| *F04D 19/00* | (2006.01) |
| *F01D 5/02* | (2006.01) |
| *F01D 5/30* | (2006.01) |
| *F01D 5/06* | (2006.01) |
| *B63H 5/08* | (2006.01) |
| *H05K 7/20* | (2006.01) |
| *F04D 17/04* | (2006.01) |
| *F04D 25/06* | (2006.01) |
| *F04D 29/58* | (2006.01) |
| *F04D 25/16* | (2006.01) |

(56) References Cited

U.S. PATENT DOCUMENTS

| | | | |
|---|---|---|---|
| RE38,382 E * | 1/2004 | Miyahara et al. | 361/697 |
| 6,877,954 B2 * | 4/2005 | Lin et al. | 416/175 |
| 7,134,839 B2 | 11/2006 | Horng et al. | |
| 7,828,510 B2 * | 11/2010 | Chang et al. | 415/61 |
| 2004/0258527 A1 * | 12/2004 | Kaneko et al. | 416/182 |
| 2011/0079374 A1 * | 4/2011 | Horng et al. | 165/121 |

FOREIGN PATENT DOCUMENTS

| | | |
|---|---|---|
| JP | 2005 214107 A * | 8/2013 |
| KR | 2002-0026725 | 4/2002 |
| TW | 515939 | 1/2003 |

* cited by examiner

FAN MODULE

BACKGROUND OF THE INVENTION

1. Field of the Invention

The present invention relates to a fan module and, more particularly, to a fan module that can draw air into the fan in different directions.

2. Description of the Related Art

Conventional cooling fans generally include axial-flow types and blower types. Axial-flow type cooling fans include an axial air inlet and an axial air outlet spaced from the axial air inlet in an axial direction. Air can be drawn in via the axial air inlet and exit via the axial air outlet to provide a cooling effect. Blower type cooling fans include an axial air inlet in an axial direction and a radial air outlet in a radial direction. Air can be drawn in via the axial air inlet and exit via the radial air outlet to provide a cooling effect.

Generally, conventional cooling fans of both the axial-flow type and the blower type can be used in various electronic products to prolong the service lives of the electronic products by providing heat dissipation. However, these conventional cooling fans of both the axial-flow type and the blower type can not fulfill the cooling need in small-size electronic products, such as notebook computers, mobile phones, and personal digital assistants, having a developing trend of miniaturization and having higher operating speeds.

In view of the above disadvantage, Taiwan Utility Model Publication No. 515939 entitled "HEAT DISSIPATING MODULES" discloses a fan module for notebook computers. With reference to FIG. 1, the fan module 8 disclosed in this patent includes a fan 81 and a heat dissipater 82. The fan 81 is mounted in a notebook computer 83 for creating air currents. The heat dissipater 82 is mounted in an air outlet of the fan 81 and engaged with chips 831 of the notebook computer 83. Thus, the fan 81 provides the chips 831 with a predetermined cooling effect.

In use, the fan 81 can only draw external air into the fan module 8 for dissipating heat in a certain portion (such as the chips 831) of the notebook computer 83. The fan 81 can not draw air in other directions into the fan module 8, failing to expel hot air currents generated by the other electronic components of the notebook computer 83 and, thus, providing limited cooling effect for the notebook computer 83.

FIG. 2 shows Taiwan Invention Publication No. I264500 entitled "BLOWER TYPE HEAT DISSIPATING FAN WITH INCREASED AIR INPUT". The cooling fan 9 disclosed in this patent includes a housing 91, a main impeller 92, and an auxiliary impeller 93. The housing 91 includes an air inlet 911 and an air outlet 912. The main impeller 92 is a blower type impeller mounted in the housing 91. The auxiliary impeller 93 is an axial-flow type impeller mounted in the air inlet 911. When the auxiliary impeller 93 rotates, the amount of air inputted via the air inlet 911 can be increased. The main impeller 92 can output the air currents in a sideward direction, increasing the overall cooling effect.

Although the amount of input air of the cooling fan 9 can be increased by the auxiliary impeller 93, the cooling fan 9 can only draw air in the axial direction into the housing 91 and, thus, has the same disadvantage of failing to draw air in other directions when the cooling fan 9 is used in a notebook computer 83 or the like.

Thus, a need exits for a novel fan module that can draw air into the fan in different directions.

SUMMARY OF THE INVENTION

The primary objective of the present invention to is provide a fan module that can draw air into the fan in two different directions. The fan module can be mounted in various electronic products to draw external air into the electronic product for dissipating heat and to expel hot air currents in the electronic product to the environment, enhancing the overall cooling effect.

According to a first aspect of the present invention, a fan module includes a housing having a first air channel and a second air channel. The housing includes an axial air inlet, a radial air inlet, and a radial air outlet. The axial air inlet is in communication with the first air channel. The radial air inlet is in communication with the second air channel. The radial air outlet is in communication with the first and second air channels. An impeller is rotatably mounted in the housing. The impeller includes a first guiding blade and a second guiding blade. The first guiding blade is adapted to draw in air currents via the axial air inlet and to expel the air currents via the radial air outlet. The second guiding blade is adapted to draw in air currents via the radial air inlet and to expel the air currents via the radial air outlet.

According to a second aspect of the present invention, a fan module includes a housing having a first air channel and a second air channel. The housing includes an axial air inlet, a radial air inlet, and first and second radial air outlets. The axial air inlet is in communication with the first air channel. The radial air inlet is in communication with the second air channel. The first and second radial air outlets are respectively in communication with the first and second air channels. An impeller is rotatably mounted in the housing and includes a first guiding blade and a second guiding blade. The first guiding blade is adapted to draw in air currents via the axial air inlet and to expel the air currents via the first radial air outlet. The second guiding blade is adapted to draw in air currents via the radial air inlet and expel the air currents via the second radial air outlet.

According to a third aspect of the present invention, a fan module includes a housing having a first air channel and a second air channel. The housing includes an axial air inlet, a radial air inlet, and a radial air outlet. The axial air inlet is in communication with the first air channel. The radial air inlet is in communication with the second air channel. The radial air outlet is in communication with the first and second air channels. A first impeller is rotatably mounted in the first air channel of the housing. The first impeller is adapted to draw in air currents via the axial air inlet and to expel the air currents via the radial air outlet. A second impeller is rotatably mounted in the second air channel of the housing. The second impeller is adapted to draw in air currents via the radial air inlet and to expel the air currents via the radial air outlet.

According to a fourth aspect of the present invention, a fan module includes a housing having a first air channel and a second air channel. The housing includes an axial air inlet, a radial air inlet, and first and second radial air outlets. The axial air inlet is in communication with the first air channel. The radial air inlet is in communication with the second air channel. The first and second radial air outlets are respectively in communication with the first and second air channels. A first impeller is rotatably mounted in the first air channel of the housing. The first impeller is adapted to draw in air currents via the axial air inlet and to expel the air currents via the first radial air outlet. A second impeller is rotatably mounted in the second air channel of the housing. The second impeller is adapted to draw in air currents via the radial air inlet and to expel the air currents via the second radial air outlet.

The present invention will become clearer in light of the following detailed description of illustrative embodiments of this invention described in connection with the drawings.

BRIEF DESCRIPTION OF THE DRAWINGS

The illustrative embodiments may best be described by reference to the accompanying drawings where.

Figure 1:
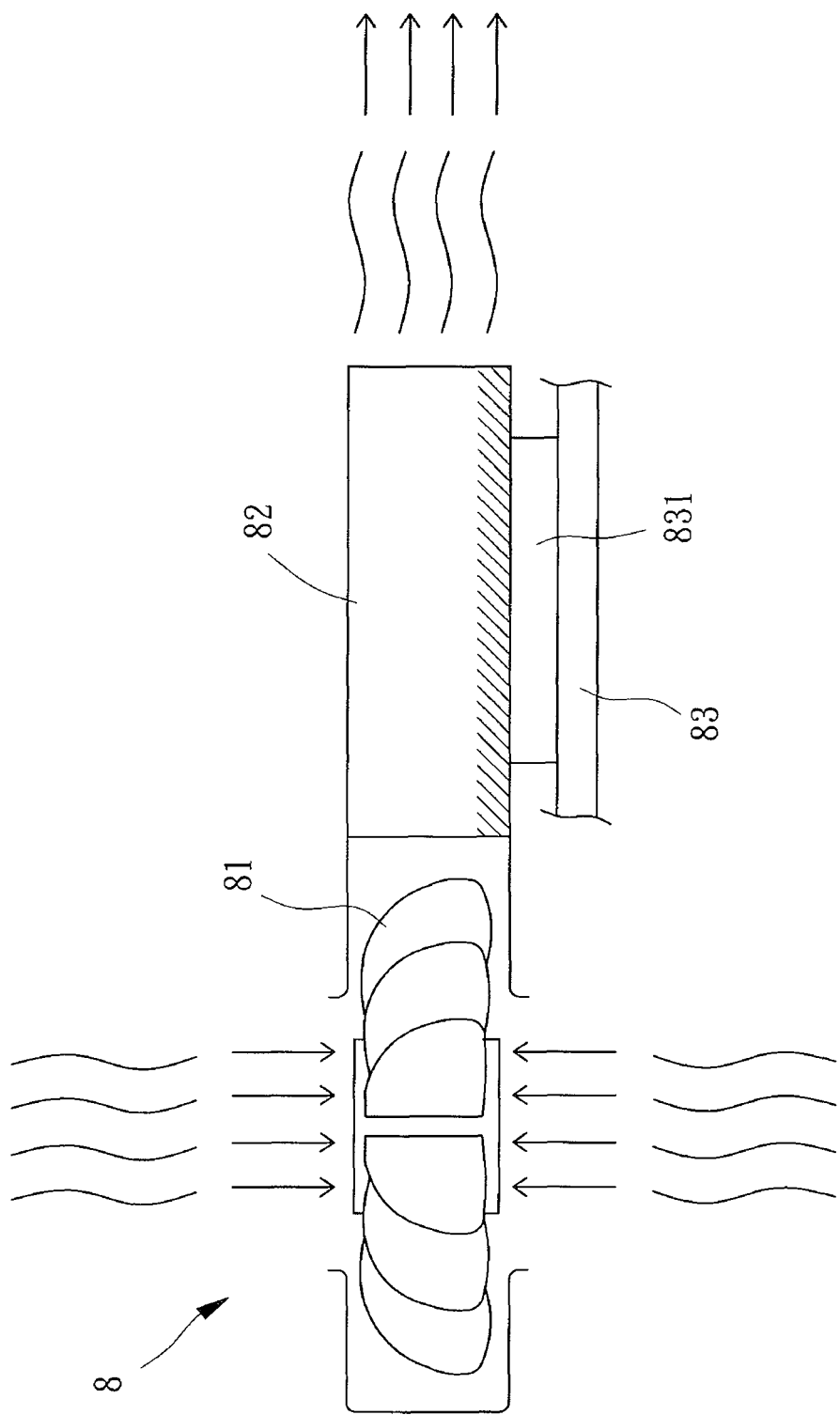
FIG. 1 shows a schematic view of a conventional fan module.
Figure 2:
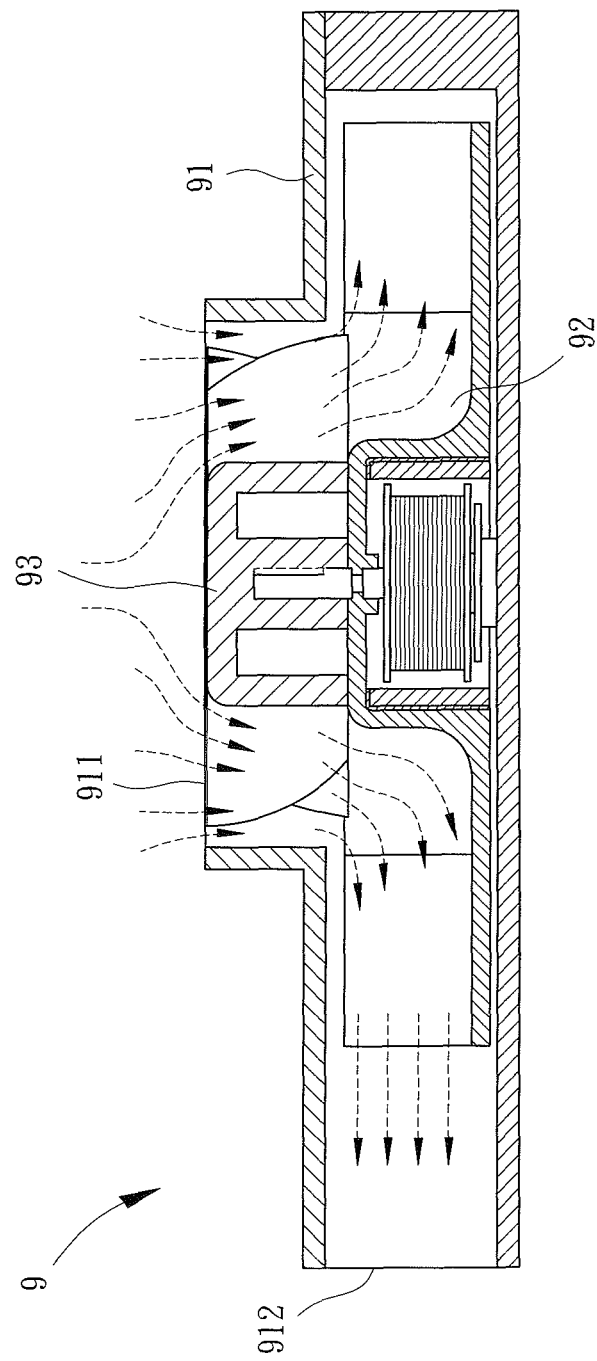
FIG. 2 shows a cross sectional view of a conventional cooling fan.

All figures are drawn for ease of explanation of the basic teachings of the present invention only; the extensions of the figures with respect to number, position, relationship, and dimensions of the parts to form the preferred embodiments will be explained or will be within the skill of the art after the following teachings of the present invention have been read and understood. Further, the exact dimensions and dimensional proportions to conform to specific force, weight, strength, and similar requirements will likewise be within the skill of the art after the following teachings of the present invention have been read and understood.

Where used in the various figures of the drawings, the same numerals designate the same or similar parts. Furthermore, when the terms "first", "second", "third", "fourth", "fifth", "portion", "section", "axial", "radial", "circumferential", "vertical", "length", and similar terms are used herein, it should be understood that these terms have reference only to the structure shown in the drawings as it would appear to a person viewing the drawings and are utilized only to facilitate describing the invention.

DETAILED DESCRIPTION OF THE INVENTION

Figure 3:
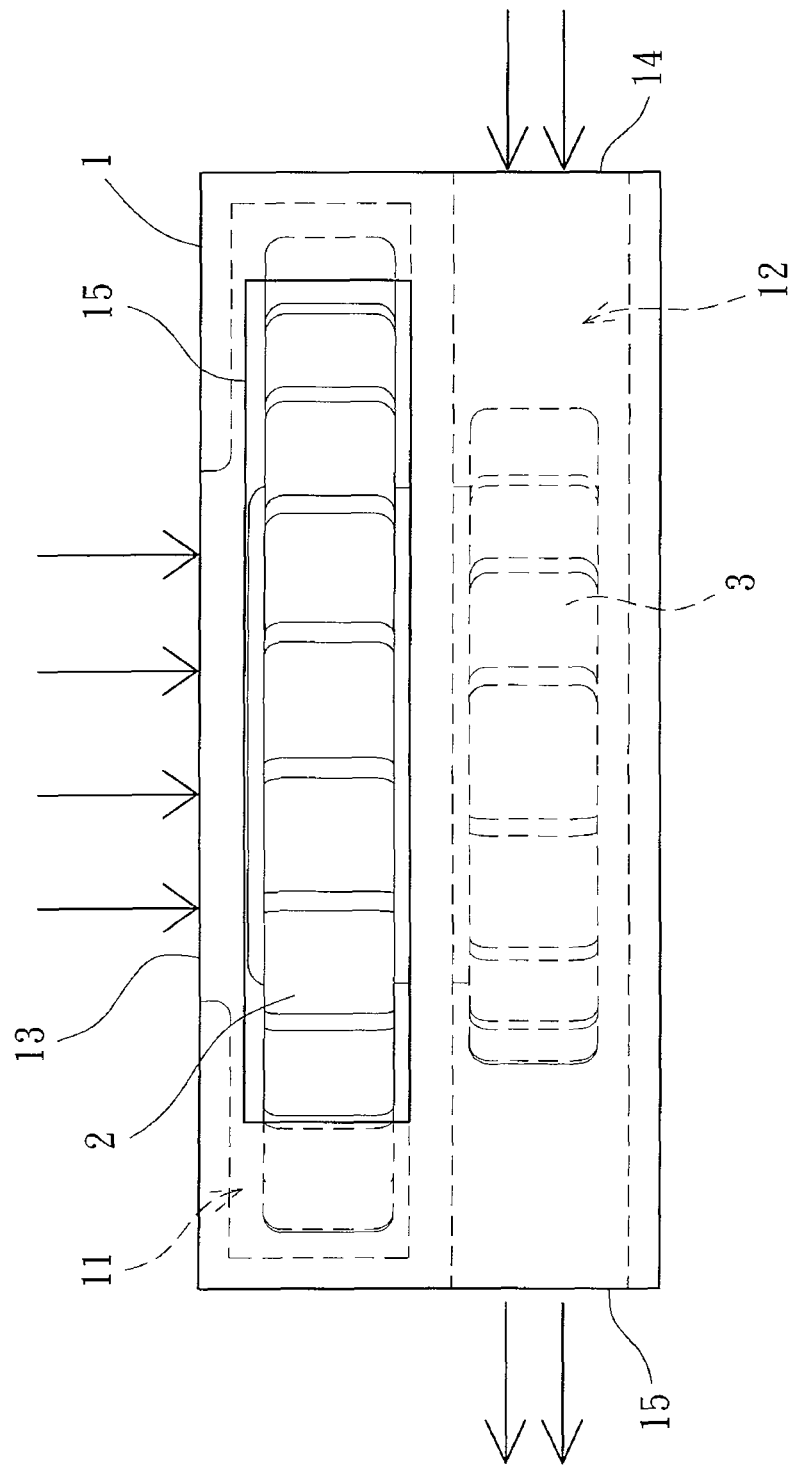
FIG. 3 shows a schematic view of a fan module according to the present invention including two impellers.

With reference to FIG. 3, a fan module according to the present invention includes a housing 1, a first impeller 2, and a second impeller 3. The housing 1 can be of any form and shape for receiving the first and second impellers 2 and 3. The first and second impellers 2 and 3 are mounted in the housing 1 for drawing in air currents in different directions to provide a predetermined cooling effect.

Figure 4:
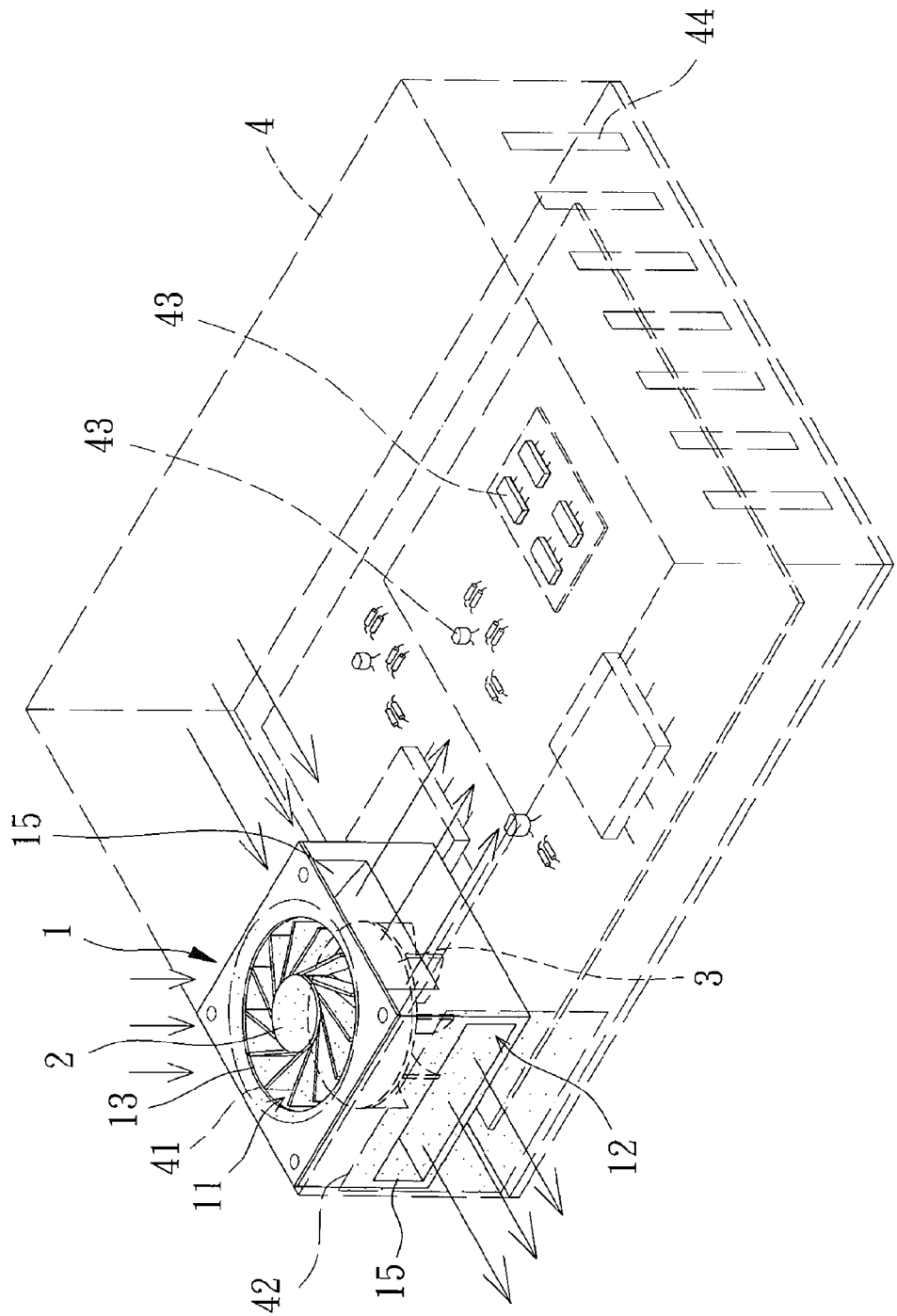
FIG. 4 shows a perspective view illustrating use of the fan module according to the present invention in an electronic product.

The housing 1 includes a first air channel 11 and a second air channel 12. The housing 1 further includes an axial air inlet 13, a radial air inlet 14, and at least one radial air outlet 15. FIG. 4 shows an example having two radial air outlets 15. The axial air inlet 13 is in communication with the first air channel 11. The radial air inlet 14 is in communication with the second air channel 12. The at least one radial air outlet 15 is in communication with the first and second air channels 11 and 12.

The first impeller 2 can be any member that can be driven to rotate for guiding air currents. The first impeller 2 is mounted in the first air channel 11 of the housing 1 for drawing air currents into the first air channel 11 via the axial air inlet 13 and then exiting via the at least one radial air outlet 15, providing heat dissipation.

The second impeller 3 can be any member that can be driven to rotate for guiding air currents. The second impeller 3 is mounted in the second air channel 12 of the housing 1 for drawing air currents into the second air channel 12 via the radial air inlet 14 and then exiting via the at least one radial air outlet 15, providing heat dissipation.

With reference to FIGS. 3 and 4, in use of the fan module according to the present invention, the fan module can be mounted in an electronic product 4, such as a notebook computer, a mobile phone, or a personal digital assistant, to provide a predetermined cooling effect. In this example, the electronic product 4 includes an air inlet portion 41 and an air outlet portion 42. The fan module according to the present invention is mounted in the electronic product 4 with the axial air inlet 13 of the housing 1 aligned with the air inlet portion 41, with the radial air inlet 14 located in an interior of the electronic product 4, with the radial air inlet 14 and one of the radial air outlets 15 facing various electronic components 43 of the electronic product 4, and with the other radial air outlet 15 aligned with the air outlet portion 42. By such an arrangement, external air can be drawn in by the first impeller 2 via the axial air inlet 13 and guided by one of the radial air outlets 15 to the electronic components 43 and then exit via auxiliary air outlets 44, providing a cooling effect. Furthermore, the second impeller 3 can draw in hot air currents resulting from operation of the electronic components 43 via the radial air inlet 14 and expel the hot air currents to the environment via the other radial air outlet 15 and the air outlet portion 42.

By the above structural design, the primary feature of the fan module according to the present invention is that the first impeller 2 draws air currents into the first air channel 11 via the axial air inlet 13 and then expels the air currents via the at least one radial air outlet 15, providing heat dissipation. At the same time, the second impeller 3 draws air currents into the second air channel 12 via the radial air inlet 14 and then expels the air currents via the at least one radial air outlet 15. Thus, the fan module according to the present invention can draw in air currents in two different directions (the axial and radial directions) and can be used in various electronic products 4. In addition to drawing in external air, the hot air currents in the electronic product 4 can be expelled to the environment to enhance the cooling efficiency.

In the example shown in FIG. 4, the axial air inlet 13 of the housing 1 is aligned with the air inlet portion 41, and the radial air inlet 14 is located in the electronic product 4. However, the axial air inlet 13 and the radial air inlet 14 of the housing 1 can be mounted in other portions of the electronic product 4 according to the needs of various electronic products to achieve the same cooling effect by drawing air in two different directions.

Figure 5:
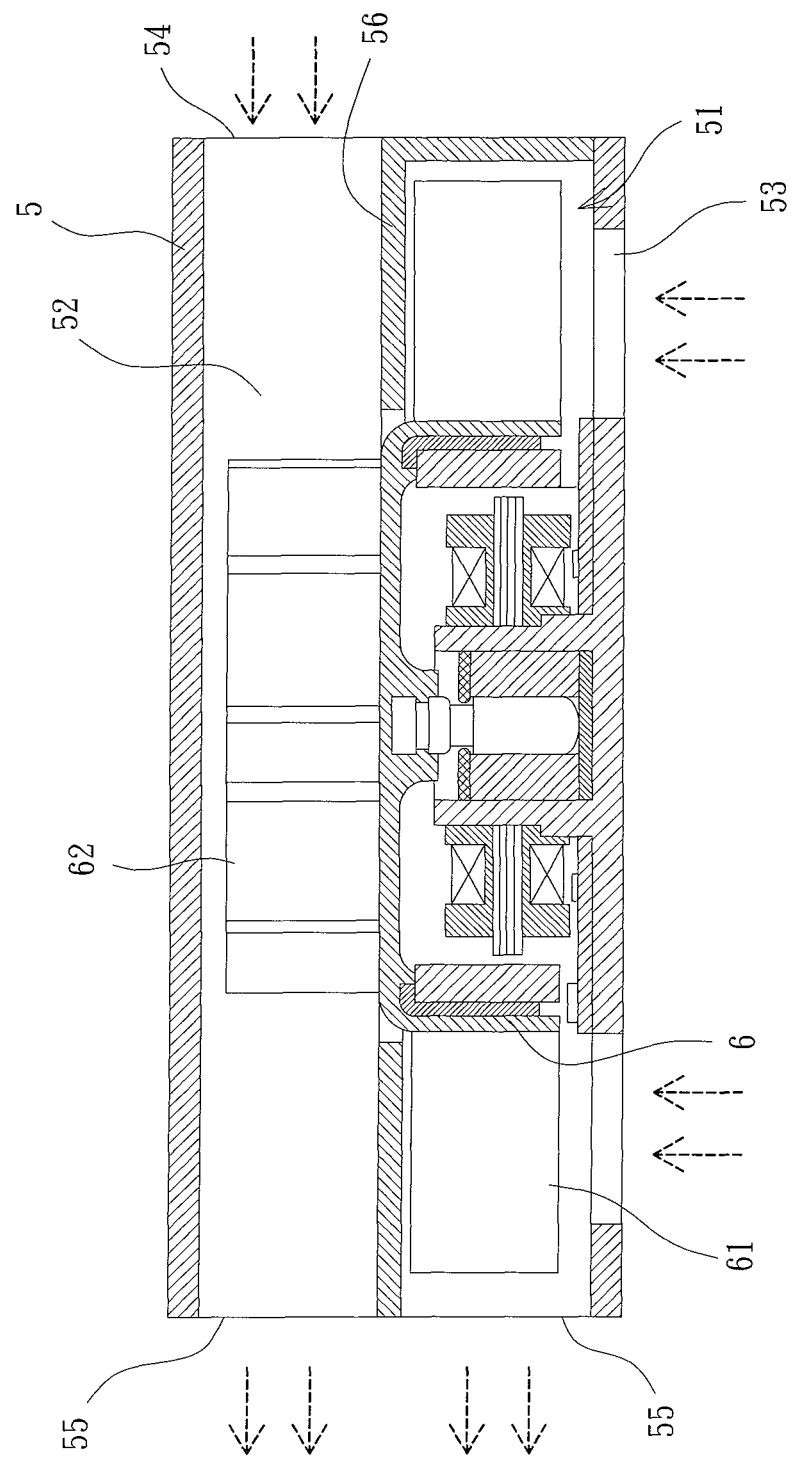
FIG. 5 shows a cross sectional view of a fan module according to the present invention including an impeller.

In an alternative example shown in FIG. 5, the fan module according to the present invention includes a housing 5 and an impeller 6 to provide a simplified structure. The housing 5 includes first and second air channels 51 and 52 spaced by a partitioning member 56. The housing 5 includes an axial air inlet 53, a radial air inlet 54, and at least one radial air outlet 55. The axial air inlet 53 is in communication with the first air channel 51. The radial air inlet 54 is in communication with the second air channel 52. The at least one radial air outlet 55 is in communication with the first and second air channels 51 and 52. The impeller 6 is mounted in the housing 5 and includes a first guiding blade 61 and a second guiding blade 62. The first guiding blade 61 is located in the first air channel 51 for drawing air currents into the first air channel 51 via the axial air inlet 53 and then expelling the air currents via the at least one radial air outlet 55. The second guiding blade 62 is located in the second air channel 52 of the housing for drawing air currents into the second air channel 52 via the radial air inlet 54 and then expelling the air currents via the at least one radial air outlet 55. Thus, by providing the first and second guiding blades 61 and 62 of the impeller 6, air currents can be drawn in two different directions, providing an enhanced cooling effect.

Since the first and second impellers 2 and 3 can draw in air currents via the axial air inlet 13 and the radial air inlet 14 for dissipating heat, the fan module according to the present invention can be embodied in a plurality of ways, some of which will be hereinafter described. However, the fan module according to the present invention is not limited to the embodiments shown and described.

Figure 6:
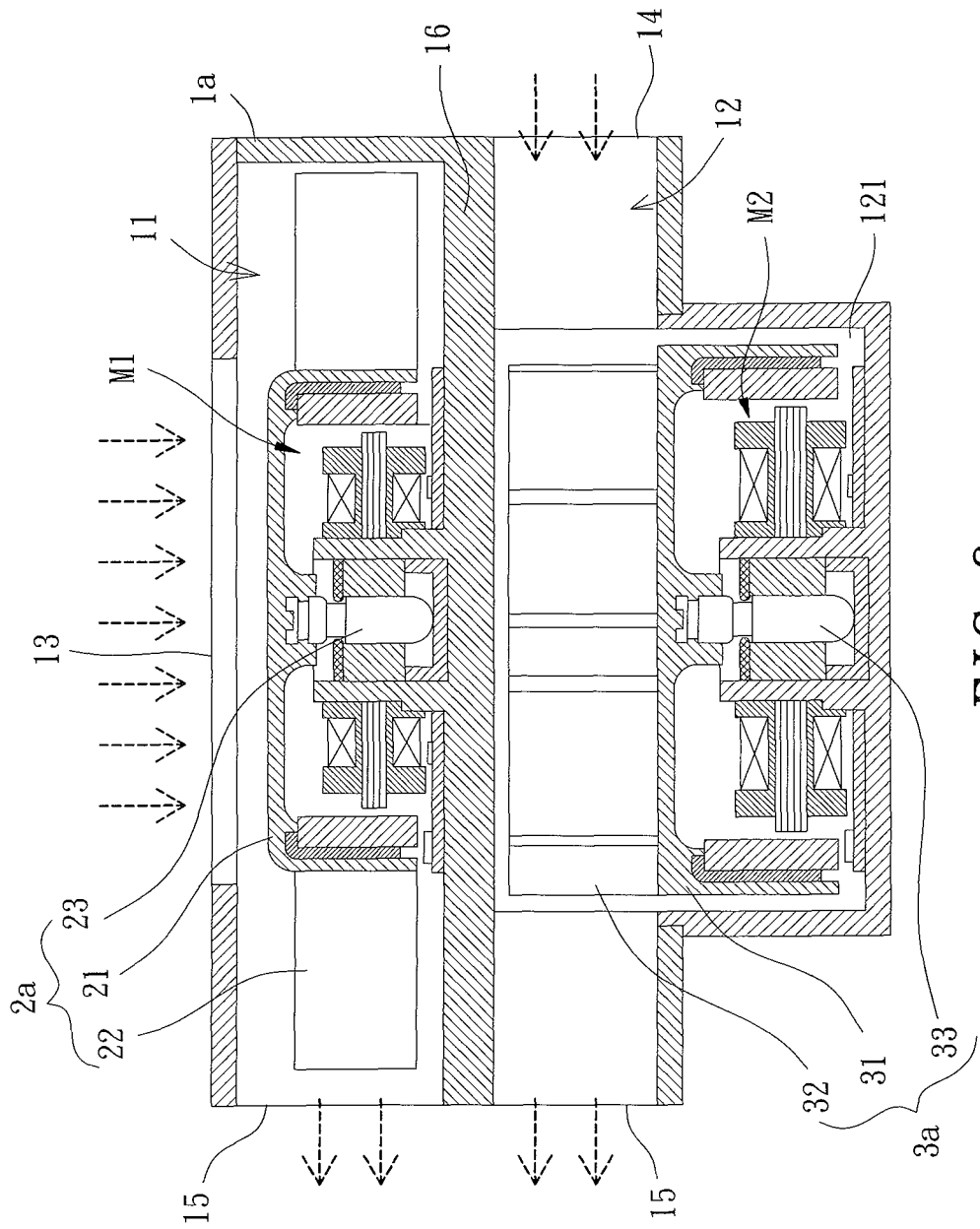
FIG. 6 shows a cross sectional view of a fan module of a first embodiment according to the present invention.

FIG. 6 shows a first embodiment of the fan module. Specifically, the fan housing 1a includes a partitioning member 16 to separate the first air channel 11 from the second air channel 12 in the housing 1a. The second air channel 12 includes a recessed portion 121. In this embodiment, there are two radial air outlets 15 located in a periphery of the housing 1a and aligned with each other in a vertical direction (as viewed from the drawing sheet). Alternatively, the radial air outlets 15 can be located in the side of the housing 1a and staggered from each other in a radial plane for respective communication with the first and second air channels 11 and 12.

The fan module includes first and second impellers 2a and 3a each having a hub 21, 31, a plurality of blades 22, 32, and a shaft 23, 33. The blades 22 of the first impeller 2a are provided on a peripheral face of the hub 21. The blades 32 of the second impeller 3a are provided on a top face of the hub 31 (as viewed from the drawing sheet). The shafts 23 and 33 are respectively coupled to central portions of the hubs 21 and 31. A first motor M1 is mounted in the first air channel 11. The shaft 23 of the first impeller 2a is rotatably connected to the first motor M1. A second motor M2 is mounted in the second air channel 12. The shaft 33 of the second impeller 3a is rotatably connected to the second motor M2. The first motor M1 can drive the first impeller 2a to rotate, and the second motor M2 can drive the second impeller 3a to rotate. The second motor M2 and the hub 31 of the second impeller 3a are received in the recessed portion 121. Only the blades 32 are received in the second air channel 12. Thus, the air currents drawn by the second impeller 3a into the second air channel 12 will not be hindered by the hub 31, effectively avoiding turbulence.

In use, the first impeller 2a draws air currents into the first air channel 11 via the axial air inlet 13 and then expels the air currents to a heat source via the radial air outlet 15 of the first air channel 11 to the heat source. At the same time, the second impeller 3a draws air currents into the second air channel 12 via the radial air inlet 14 and then expels the air currents to another heat source via the radial air outlet 15 of the second air channel 12. By such an arrangement, the fan module of the first embodiment according to the present invention can be used in various electronic products in a way substantially the same as the example shown in FIG. 4. Air currents can be guided into the fan module in two different directions, enhancing the cooling effect.

Figure 7:
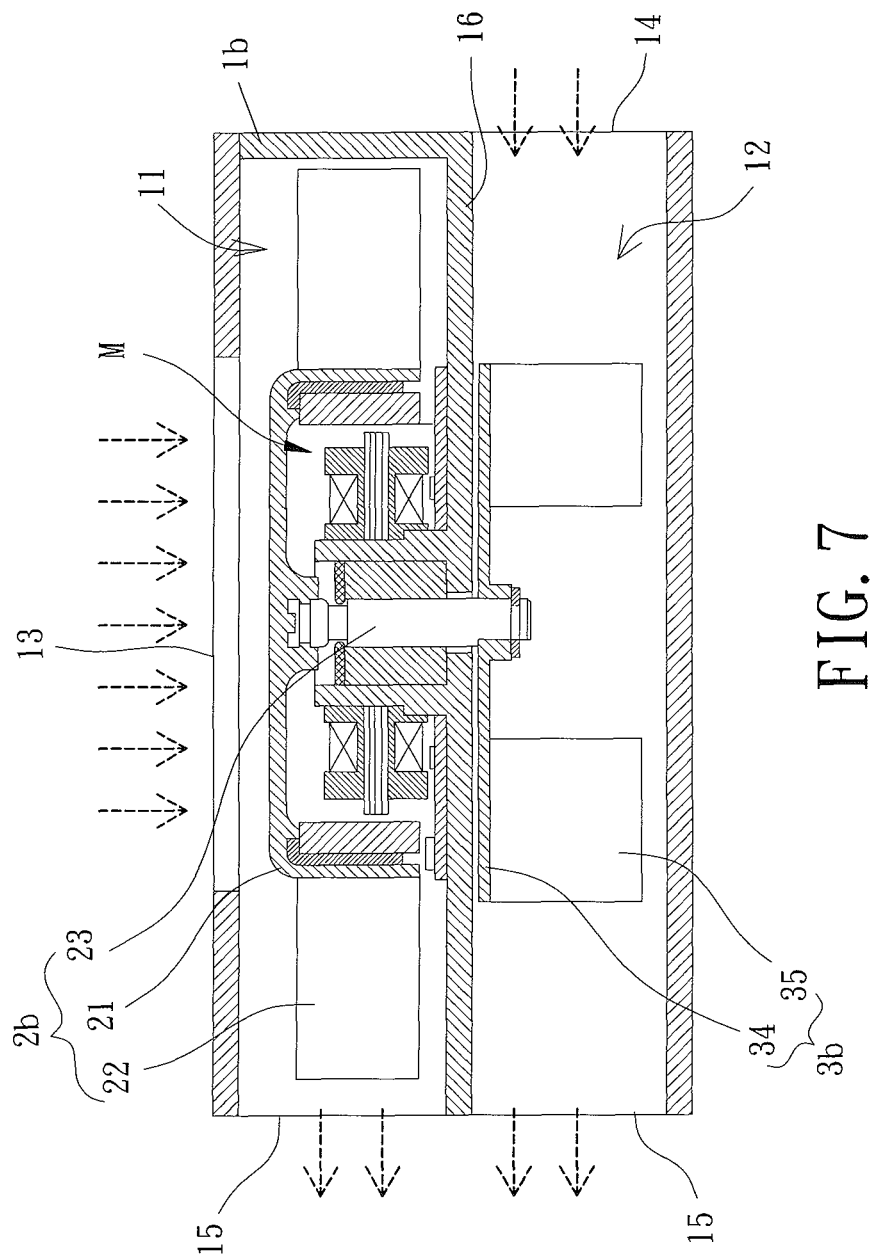
FIG. 7 shows a cross sectional view of a fan module of a second embodiment according to the present invention.

FIG. 7 shows a fan module of a second embodiment according to the present invention which is substantially the same as the first embodiment except that the housing 1b of the second embodiment does not include the recessed portion 121. Furthermore, the first impeller 2a has a hub 21, a plurality of blades 22, and a shaft 23. The blades 22 are provided on a peripheral face of the hub 21. The shaft 23 is coupled to a central portion of the hub 21. A motor M is mounted in the first air channel 11 of the housing 1b. The shaft 23 is rotatably connected to the motor M and extended through the motor M into the second air channel 12. The second impeller 3b includes a rotatable disc 34 engaged with the shaft 23 and a plurality of blades 35 engaged with the rotatable disc 34. The motor M can drive the shaft 23 to rotate for simultaneously rotating the first and second impellers 2b and 3b. While air currents are drawn by the second impeller 3b into the second air channel 12 via the radial air inlet 14 and pass through the second air channel 12, the flow of the air currents are less likely to be hindered by the rotatable disc 34. In brief, the fan module of the second embodiment is simple in structure and has a reduced axial length as compared to the fan module of the first embodiment.

Figure 8:
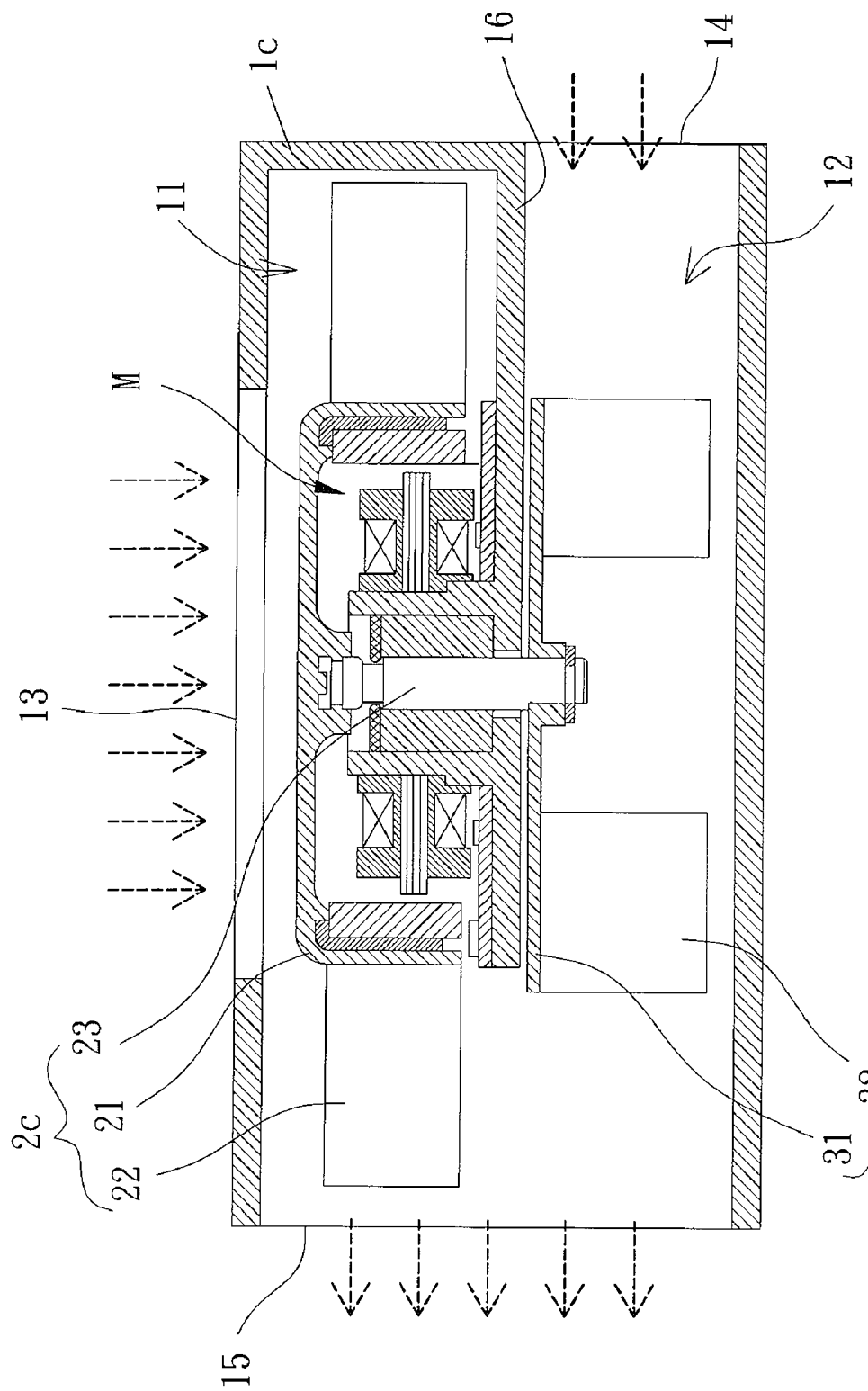
FIG. 8 shows a cross sectional view of a fan module of a third embodiment according to the present invention.

FIG. 8 shows a fan module of a third embodiment according to the present invention. The fan module of the third embodiment includes a housing 1c and first and second impellers 2c and 3c. The fan module of the third embodiment is substantially the same as the fan module of the second embodiment except that housing 1c has only one radial air outlet 15 located in a periphery of the housing 1c and in communication with the first and second air channels 11 and 12. In brief, the structure of the fan module of the third embodiment is simpler than that of the fan module of the second embodiment while achieving the same function.A9

Figure 9:
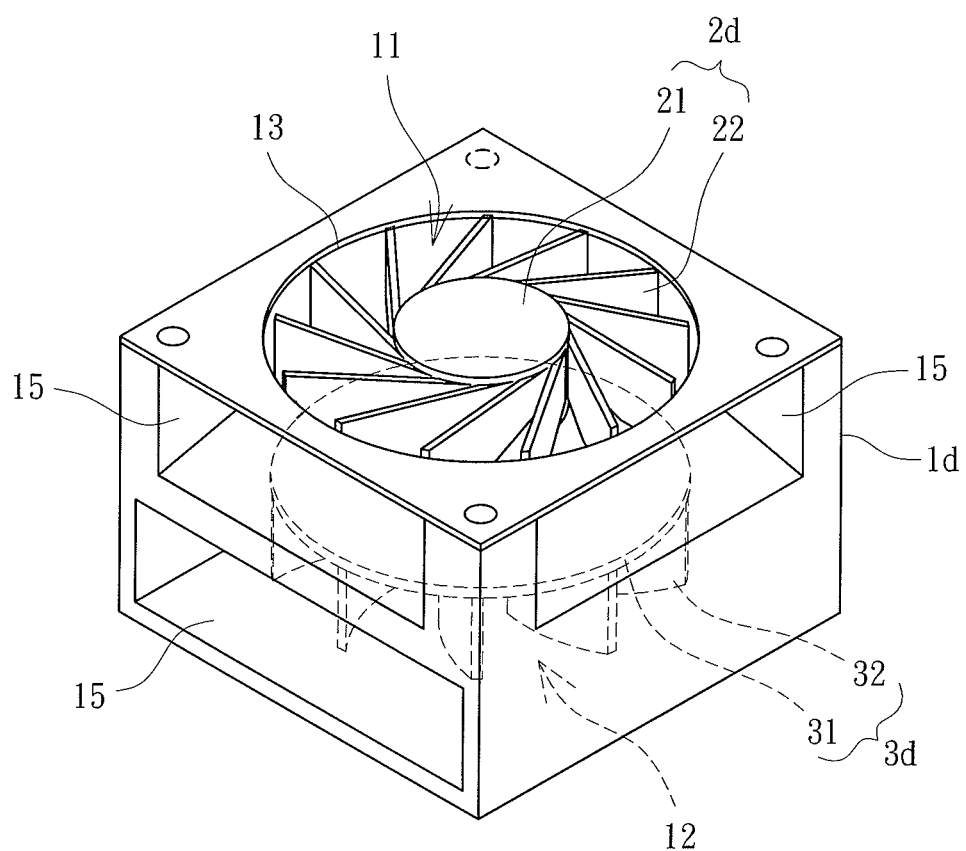
FIG. 9 shows a fan module of a fourth embodiment according to the present invention.

FIG. 9 shows a fan module of a fourth embodiment according to the present invention. The fan module of the fourth embodiment includes a housing 1d and first and second impellers 2d and 3d. The fan module of the fourth embodiment is substantially the same as the fan module of the third embodiment except that housing 1d has three radial air outlets 15 located in a periphery of the housing 1c. Two of the radial air outlets 15 are in communication with the first air channel 11. The remaining radial air outlets 15 are in communication with the second air channel 12. In brief, the structure of the fan module of the fourth embodiment is superior to the first, second, and third embodiments in terms of air output.

Figure 10:
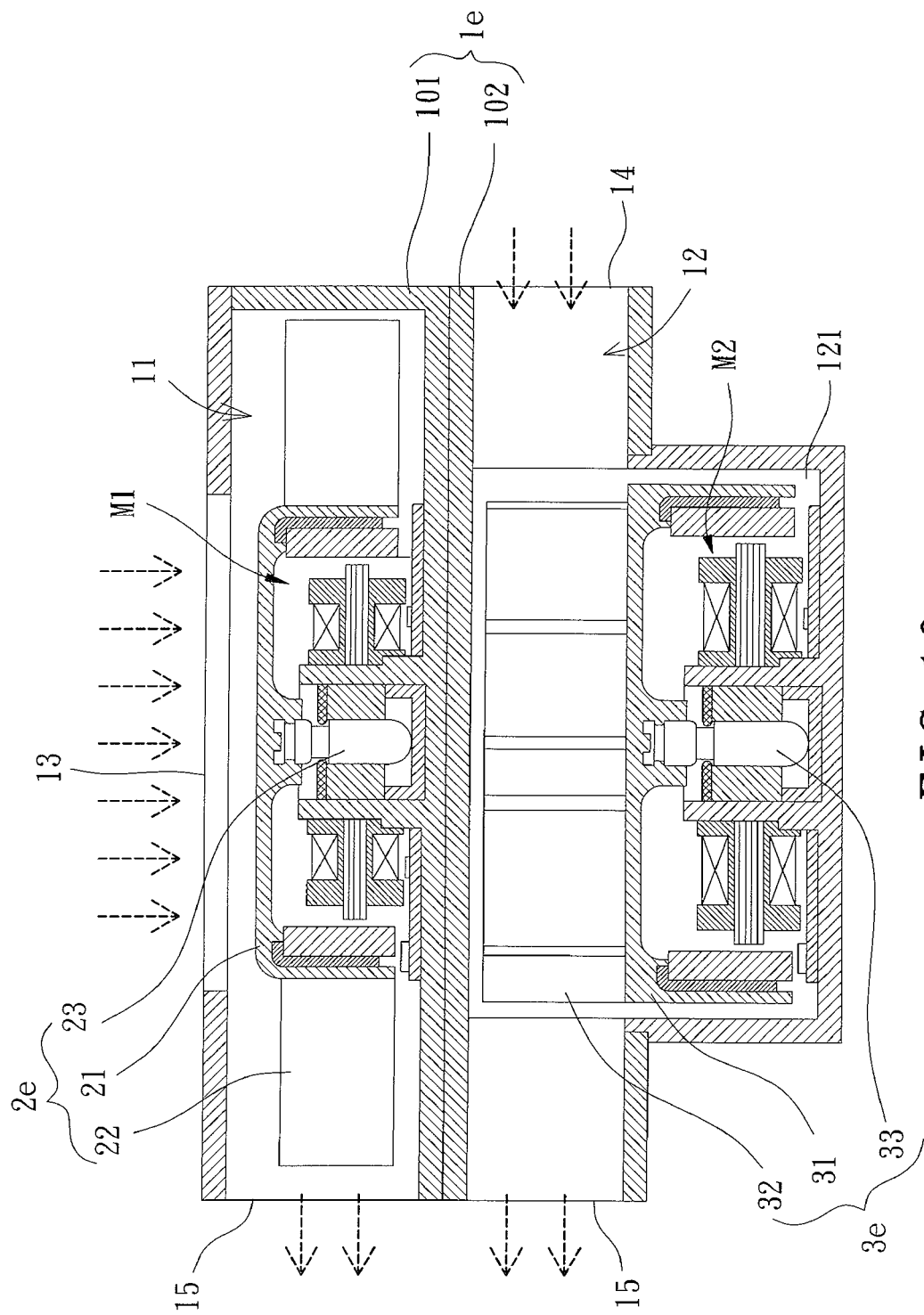
FIG. 10 shows a cross sectional view of a fan module of a fifth embodiment according to the present invention.

FIG. 10 shows a fan module of a fifth embodiment according to the present invention. The fan module of the fifth embodiment is substantially the same as the fan module of the first embodiment except that housing 1e is comprised of a first housing section 101 and a second housing section 102. The first and second air channels 11 and 12 are respectively formed in the first and second housing sections 101 and 102. The fan module of the fifth embodiment has two radial air outlets 15, one of which is located in a periphery of the first housing section 101, and the other of which is located in a periphery of the second housing section 102. The radial air outlets 15 are respectively in communication with the first and second air channels 11 and 12. A first motor M1 is mounted in the first air channel 11 of the first housing section 101 to drive the first impeller 2e to rotate, and a second motor M2 is mounted in the second air channel 12 of the second housing section 102 to drive the second impeller 3e to rotate, achieving the same functions as the above embodiments.

In view of the foregoing, the fan module according to the present invention provides first and second impellers 2 and 3 to draw in air currents from two different directions via the axial air inlet 13 and the radial air inlet 14 and then expel the air currents through at least one radial air outlet 15 to the predetermined area, allowing application in various electronic products 4. In addition to drawing in external air for heat dissipation, the hot air currents in the electronic products 4 can be expelled to the environment, enhancing the cooling effect.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

What is claimed is:

1. A fan module comprising:
a housing including a first air channel and a second air channel, with the housing including an axial air inlet, a radial air inlet and a radial air outlet, with the axial air inlet in communication with the first air channel, with the radial air inlet in communication with the second air channel, with the radial air outlet in communication with the first and second air channels; and
an impeller rotatably mounted in the housing, with the impeller including a first guiding blade and a second guiding blade, with the first guiding blade adapted to draw in air currents via the axial air inlet and to expel the air currents via the radial air outlet, with the second guiding blade adapted to draw in air currents via the radial air inlet and to expel the air currents via the radial air outlet, with the impeller rotatably mounted about an axis in the housing, with the second air channel being parallel to and spaced from the first air channel and perpendicular to the axis, with the radial air inlet aligned in a radial plane perpendicular to the axis with the second air channel, with the radial air outlet aligned in the radial plane with each of the first and second air channels, with the axial air inlet aligned in an axial plane parallel to the axis with the first air channel.

2. The fan module as claimed in claim 1, with the housing including a partitioning member separating the first air channel from the second air channel, with the partitioning member located intermediate the axial air inlet and the radial air inlet.

3. The fan module as claimed in claim 2, further comprising: a motor mounted in the first air channel of the housing, with the impeller rotatably connected to the motor.

4. The fan module as claimed in claim 1, with the first air guiding blade located in the first air channel, with the second guiding blade located in the second air channel.

5. The fan module as claimed in claim 2, wherein the housing further includes a bottom plate, a top plate and a lateral wall, wherein the partitioning member includes a first face and a second face opposite to the first face, wherein the first face faces the bottom plate of the housing, wherein the second face faces the top plate of the housing, wherein the first air channel is formed between the first face of the partitioning member and the bottom plate of the housing, wherein the second air channel is formed between the second face of the partitioning member and the top plate of the housing, wherein the lateral wall extends from the first face of the partitioning member to the bottom plate, wherein the axial air inlet extends through the bottom plate of the housing and is in communication with the first air channel, wherein the first guiding blade is located in the first air channel, and wherein the second guiding blade is located in the second air channel.

6. A fan module maimed comprising:
a housing including a first air channel and a second air channel, with the housing including an axial air inlet, a radial air inlet, and first and second radial air outlets, with the axial air inlet in communication with the first air channel, with the radial air inlet in communication with the second air channel, with the first and second radial air outlets respectively in communication with the first and second air channels; and
an impeller rotatably mounted in the housing, with the impeller including a first guiding blade and a second guiding blade, with the firs guiding blade adapted to draw in air currents via the axial air inlet and to expel the air currents via the first radial air outlet, with the second guiding blade adapted to draw in air currents via the radial air inlet and expel the air currents via the second radial air outlet, with the impeller rotatably mounted about an axis in the housing, with the second air channel being parallel to and spaced from the first air channel and perpendicular to the axis, with the radial air inlet aligned in a radial plane perpendicular to the axis with the second air channel, with the first radial outlet aligned in the radial plane with the first air channel and the second radial outlet aligned in the radial plane with the second air channel, with the axial air inlet aligned in an axial plane parallel to the axis with the first air channel.

7. The fan module as claimed in claim 6, with the housing including a partitioning member separating the first air channel from the second air channel, with the partitioning member located intermediate the axial air inlet and the radial air inlet.

8. The fan module as claimed in claim 6, further comprising: a motor mounted in the first air channel of the housing, with the impeller rotatably connected to the motor.

9. The fan module as claimed in claim 6, with the first air guiding blade located in the first air channel, with the second guiding blade located in the second air channel.

10. The fan module as claimed in claim 6, with the first and second radial air outlets aligned with each other and located in a periphery of the housing for respective communication with the first and second air channels.

11. The fan module as claimed in claim 6, with the first and second radial air outlets staggered from each other in the radial plane and located in a periphery of the housing for respective communication with the first and second air channels.

12. The fan module as claimed in claim 7, wherein the housing further includes a bottom plate, a top plate and a lateral wall, wherein the partitioning member includes a first face and a second face opposite to the first face, wherein the first face faces the bottom plate of the housing, wherein the second face faces the top plate of the housing, wherein the first air channel is formed between the first face of the partitioning member and the bottom plate of the housing, wherein the second air channel is formed between the second face of the partitioning member and the top plate of the housing, wherein the lateral wall extends from the first face of the partitioning member to the bottom plate, wherein the axial air inlet extends through the bottom plate of the housing and is in communication with the first air channel, wherein the first guiding blade is located in the first air channel, and wherein the second guiding blade is located in the second air channel.

13. A fan module comprising:
a housing including a first air channel and a second air channel, with the housing including an axial air inlet, a radial air inlet and a radial air outlet, with the axial air inlet in communication with the first air channel, with the radial air inlet in communication with the second air channel, with the radial air outlet in communication with the first and second air channels;
a first impeller rotatably mounted in the first air channel of the housing, with the first impeller adapted to draw in air currents via the axial air inlet and to expel the air currents via the radial air outlet; and a second impeller rotatably mounted in the second air channel of the housing, with the second impeller adapted to draw in air currents via the radial air inlet and to expel the air currents via the radial air outlet, with the second impeller rotatably mounted about an axis in the housing, with the second air channel being parallel to and spaced from the first air channel and perpendicular to the axis, with the radial air inlet aligned in a radial plane perpendicular to the axis with the second air channel, with the radial air outlet aligned in the radial plane with each of the first and second air channels, with the axial air inlet aligned in an axial plane parallel to the axis with the first air channel.

14. The fan module as claimed in claim 13, further comprising: a first motor mounted in the first air channel, with the first impeller rotatably connected to the first motor; and a second motor mounted in the second air channel, with the second impeller rotatably connected to the second motor.

15. The fan module as claimed in claim 4, with each of the first and second impellers including a hub, a plurality of blades and a shaft, with the plurality of blades of the first impeller provided on a peripheral face of the hub of the first impeller, with the plurality of blades of the second impeller provided on a top face of the hub of the second impeller, with the shaft of the first impeller coupled to the hub of the first impeller and rotatably connected to the first motor, with the shaft of the second impeller coupled to the hub of the second impeller and rotatably connected to the second motor.

16. The fan module as claimed in claim 15, with the second air channel including a recessed portion, with the second motor and the hub of the second impeller received in the recessed portion.

17. The fan module as claimed in claim 13, further comprising: a motor mounted in the first air channel, with the first and second impellers rotatably connected to the motor.

18. The fan module as claimed in claim 17, with the first impeller including a hub, a plurality of blades and a shaft, with the plurality of blades of the first impeller provided on a peripheral face of the hub of the first impeller, with the shaft coupled to the hub and rotatably connected to the motor, with the shaft extending through the motor into the second air channel, with the second impeller including a rotatable disc engaged with the shaft and a plurality of blades engaged with the rotatable disc.

19. The fan module as claimed in claim 13, with the housing including a partitioning member separating the first air channel from the second air channel, with the partitioning member located intermediate the axial air inlet and the radial air inlet.

20. The fan module as claimed in claim 13, with the radial air outlet located in a periphery of the housing and in communication with the first and second air channels.

21. The fan module as claimed in claim 19, wherein the housing further includes a bottom plate, a top plate and a lateral wall, wherein the partitioning member includes a first face and a second face opposite to the first face, wherein the first face faces the bottom plate of the housing, wherein the second face faces the top plate of the housing, wherein the first air channel is formed between the first face of the partitioning member and the bottom plate of the housing, wherein the second air channel is formed between the second face of the partitioning member and the top plate of the housing, wherein the lateral wall extends from the first face of the partitioning member to the bottom plate, wherein the axial air inlet extends through the bottom plate of the housing and is in communication with the first air channel, wherein the first impeller is located in the first air channel, and wherein the second impeller is located in the second air channel.

22. A fan module as-claimed comprising:
a housing including a first air channel and a second air channel, with the housing including an axial air inlet, a radial air inlet, and first and second radial air outlets, with the axial air inlet in communication with the first air channel with the radial air inlet in communication with the second air channel, with the first and second radial air outlets respectively in communication with the first and second air channels;
a first impeller rotatably mounted in the first air channel of the housing, with the first impeller adapted to draw in air currents via the axial air inlet and to expel the air currents via the first radial air outlet; and
a second impeller rotatably mounted in the second air channel of the housing, with the second impeller adapted to draw in air currents via the radial air inlet and to expel the air currents via the second radial air outlet, with the second impeller rotatably mounted about an axis in the housing, with the second air channel being parallel to and spaced from the first air channel and perpendicular to the axis, with the radial air inlet aligned in a radial plane perpendicular to the axis with the second air channel, with the first radial outlet aligned in the radial plane with the first air channel and the second radial outlet aligned in the radial plane with the second air channel, with the axial air inlet aligned in an axial plane parallel to the axis with the first air channel.

23. The fan module as claimed in claim 22, further comprising: a first motor mounted in the first air channel, with the first impeller rotatably connected to the first motor; and a second motor mounted in the second air channel, with the second impeller rotatably connected to the second motor.

24. The fan module as claimed in claim 23, with each of the first and second impellers including a hub, a plurality of blades and a shaft, with the plurality of blades of the first impeller provided on a peripheral face of the hub of the first impeller, with the plurality of blades of the second impeller provided on a top face of the hub of the second impeller, with the shaft of the first impeller coupled to the hub of the first impeller and rotatably connected to the first motor, with the shaft of the second impeller coupled to the hub of the second impeller and rotatably connected to the second motor.

25. The fan module as claimed in claim 24, with the second air channel including a recessed portion, with the second motor and the hub of the second impeller received in the recessed portion.

26. The fan module as claimed in claim 22, further comprising: a motor mounted in the first air channel, with the first and second impellers rotatably connected to the motor.

27. The fan module as claimed in claim 26, with the first impeller including a hub, a plurality of blades and a shaft, with the plurality of blades of the first impeller provided on a peripheral face of the hub of the first impeller, with the shaft coupled to the hub and rotatably connected to the motor, with the shaft extending through the motor into the second air channel, with the second impeller including a rotatable disc engaged with the shaft and a plurality of blades engaged with the rotatable disc.

28. The fan module as claimed in claim 22, with the housing including a partitioning member separating the first air channel from the second air channel, with the partitioning member located intermediate the axial air inlet and the radial air inlet.

29. The fan module as claimed in claim 22, with the first and second radial air outlets aligned with each other and located in a periphery of the housing for respective communication with the first and second air channels.

30. The fan module as claimed in claim 22, with the first and second radial air outlets staggered from each other in the radial plane and located in a periphery of the housing for respective communication with the first and second air channels.

31. The fan module as claimed in claim 22, with the housing comprised of a first housing section and a second housing section, with the first air channel formed in the first housing section, with the second air channel formed in the second housing section, with the first radial air outlet located in a periphery of the first housing section, with the second radial air outlet located in a periphery of the second housing section.

32. The fan housing as claimed in claim 31, further comprising: a first motor mounted in the first air channel in the first housing section, with the first impeller rotatably connected to the first motor; and a second motor mounted in the second air channel in the second housing section, with the second impeller rotatably connected to the second motor.

33. The fan module as claimed in claim 28, wherein the housing further includes a bottom plate, a top plate and a lateral wall, wherein the partitioning member includes a first face and a second face opposite to the first face, wherein the first face faces the bottom plate of the housing, wherein the second face faces the top plate of the housing, wherein the first air channel is formed between the first face of the partitioning member and the bottom plate of the housing, wherein the second air channel is formed between the second face of the partitioning member and the top plate of the housing, wherein the lateral wall extends from the first face of the partitioning member to the bottom plate, wherein the axial air inlet extends through the bottom plate of the housing and is in communication with the first air channel, wherein the first impeller is located in the first air channel, and wherein the second impeller is located in the second air channel.

* * * * *